United States Patent
Matsumoto et al.

(10) Patent No.: US 10,274,754 B2
(45) Date of Patent: Apr. 30, 2019

(54) MAGNETO-OPTICAL MATERIAL, METHOD FOR PRODUCING SAME AND MAGNETO-OPTICAL DEVICE

(71) Applicant: Shin-Etsu Chemical Co., Ltd., Tokyo (JP)

(72) Inventors: Takuto Matsumoto, Annaka (JP); Masanori Ikari, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 58 days.

(21) Appl. No.: 15/554,640

(22) PCT Filed: Mar. 10, 2016

(86) PCT No.: PCT/JP2016/057600
§ 371 (c)(1),
(2) Date: Aug. 30, 2017

(87) PCT Pub. No.: WO2016/143859
PCT Pub. Date: Sep. 15, 2016

(65) Prior Publication Data
US 2018/0017816 A1    Jan. 18, 2018

(30) Foreign Application Priority Data
Mar. 11, 2015  (JP) ................................ 2015-048149
Feb. 19, 2016  (WO) ................. PCT/JP2016/054856

(51) Int. Cl.
*G02B 5/30* (2006.01)
*G02F 1/00* (2006.01)
*C04B 35/50* (2006.01)
(Continued)

(52) U.S. Cl.
CPC ......... *G02F 1/0036* (2013.01); *C01G 19/006* (2013.01); *C01G 23/003* (2013.01);
(Continued)

(58) Field of Classification Search
CPC .. C01G 19/006; C01G 23/003; C01G 25/006; C01G 27/006; C01G 35/006;
(Continued)

(56) References Cited

U.S. PATENT DOCUMENTS 6,208,795 B1  3/2001 Nakano et al.
8,343,884 B2  1/2013 Menke et al.
(Continued)

FOREIGN PATENT DOCUMENTS

DE  10 2010 021 203 A1  11/2011
JP  2000-266947 A  9/2000
(Continued)

OTHER PUBLICATIONS

Fleet et al., "Rare earth disilicates $R_2Si_2O_7$ (R=Gd, Tb, Dy, Ho): type B", Z., Kristallogr., 2003, vol. 218, No. 12, pp. 795-801, cited in Specification (7 pages).
(Continued)

*Primary Examiner* — William R Alexander
*Assistant Examiner* — Balram T Parbadia
(74) *Attorney, Agent, or Firm* — Westerman, Hattori, Daniels & Adrian, LLP

(57) ABSTRACT

Provided, as a transparent magneto-optical material which does not absorb fiber laser light within a wavelength range of 0.9-1.1 μm and is thus suitable for constituting a magneto-optical device such as an optical isolator wherein the formation of a thermal lens is suppressed, is a magneto-optical material which is composed of a transparent ceramic that contains a complex oxide represented by formula (1) as a main component, or which is composed of a single crystal of a complex oxide represented by formula (1).

$$Tb_{2x}R_{2(2-x)}O_{8-x} \quad (1)$$

(In the formula, $0.800 < x < 1.00$, and R represents at least one element selected from the group consisting of silicon, ger-
(Continued)

manium, titanium, tantalum tin, hafnium and zirconium (excluding the cases where R represents only silicon, germanium or tantalum)).

15 Claims, 3 Drawing Sheets

(51) Int. Cl.
| | |
|---|---|
| *C30B 29/22* | (2006.01) |
| *G02B 1/02* | (2006.01) |
| *G02B 27/28* | (2006.01) |
| *C01G 19/00* | (2006.01) |
| *C01G 23/00* | (2006.01) |
| *C01G 25/00* | (2006.01) |
| *C01G 27/00* | (2006.01) |
| *C01G 35/00* | (2006.01) |
| *C04B 35/626* | (2006.01) |
| *C04B 35/645* | (2006.01) |
| *G02F 1/09* | (2006.01) |

(52) U.S. Cl.
CPC ......... *C01G 25/006* (2013.01); *C01G 27/006* (2013.01); *C01G 35/006* (2013.01); *C04B 35/50* (2013.01); *C04B 35/6262* (2013.01); *C04B 35/62645* (2013.01); *C04B 35/6455* (2013.01); *C30B 29/22* (2013.01); *G02B 1/02* (2013.01); *G02B 27/28* (2013.01); *G02F 1/093* (2013.01); *C01P 2002/50* (2013.01); *C01P 2002/76* (2013.01); *C04B 2235/3224* (2013.01); *C04B 2235/3248* (2013.01)

(58) Field of Classification Search
CPC ................ C04B 35/50; C04B 35/6262; C04B 35/62645; C04B 35/6455; C04B 2235/3224; C04B 2235/3248; C30B 29/22; G02B 1/02; G02B 27/28; G02F 1/0036; G02F 1/093; C01P 2002/50; C01P 2002/76
See application file for complete search history.

(56) References Cited

U.S. PATENT DOCUMENTS

| | | |
|---|---|---|
| 8,753,538 B2 | 6/2014 | Makikawa et al. |
| 2011/0129179 A1* | 6/2011 | Jiang ................. C03C 13/00 385/11 |
| 2011/0133111 A1* | 6/2011 | Makikawa .............. C04B 35/50 252/62.51 R |
| 2012/0236409 A1* | 9/2012 | Yahagi .................... G02F 1/093 359/484.03 |
| 2013/0222909 A1* | 8/2013 | Makikawa .............. C30B 13/24 359/484.03 |
| 2014/0001424 A1* | 1/2014 | Shimada ................. C04B 35/50 252/583 |
| 2014/0002900 A1 | 1/2014 | Makikawa et al. |
| 2016/0201222 A1* | 7/2016 | Ikari ...................... C30B 29/22 423/263 |
| 2016/0209683 A1* | 7/2016 | Ikari ................... C01F 17/0093 |
| 2017/0205643 A1* | 7/2017 | Makikawa .............. C01F 17/00 |

FOREIGN PATENT DOCUMENTS

| | | |
|---|---|---|
| JP | 2002-293693 A | 10/2002 |
| JP | 2005-330133 A | 12/2005 |
| JP | 2010-241677 A | 10/2010 |
| JP | 2010-285299 A | 12/2010 |
| JP | 2011-121837 A | 6/2011 |
| JP | 2011-213552 A | 10/2011 |
| JP | 2012-206935 A | 10/2012 |
| WO | 2015/037649 A1 | 3/2015 |

OTHER PUBLICATIONS

Ji et al., "Fabrication of transparent $La_2Hf_2O_7$ ceramics from combustion synthesized powders," Materials Research Bulletin, 2005, vol. 40, No. 3, pp. 553-559, cited in Specification (7 pages).

Andrievskaya, "Phase equilibria in the refractory oxide systems of zirconia, hafnia and yttria with rare-earth oxides," Journal of European Ceramic Society, 2008, vol. 28, No. 12, pp. 2363-2388, cited in Specification (26 pages).

Lau et al., "Stuffed Rare Earth Pyrochlore Solid Solutions", J. solid state chem., 2006, vol. 179, pp. 3126-3135, cited in Specification (25 pages).

Taniguchii et al , "Long-range order and spin-liquid states of polycrystalline $Tb_{2+}Ti_{2-x}O_{7+y}$", Physical Revibw B, 2013, vol. 87, No. 6, pp. 060408.1-060408.5, cited in ISR (5 pages).

Guo et al., "Growth and Faraday rotation characteristics of $Tb_2Sn_2O_7$ crystal", Journal of Crystal Growth, 2014, No. 397, pp. 19-23, cited in ISR (5 pages).

International Search Report dated Apr. 5, 2016, issued in counterpart International Application No. PCT/JP2016/057600 (2 pages).

* cited by examiner

MAGNETO-OPTICAL MATERIAL, METHOD FOR PRODUCING SAME AND MAGNETO-OPTICAL DEVICE

TECHNICAL FIELD

The present invention relates to a magneto-optical material and also to a magneto-optical device. More particularly, the inventions relate to a magneto-optical material made of a transparent ceramic or a single crystal containing a complex oxide suitable for constituting a magneto-optical device such as an optical isolator and a method for producing the same, and also to a magneto-optical device using the magneto-optical material.

BACKGROUND ART

In recent years, partly on account of the higher power levels that have become possible, there has been a remarkable growth in the use of laser beam machines which employ fiber lasers. However, the resonance state of the laser light source within a laser beam machine is destabilized by the entry of outside light, disturbing the oscillation state. Disruption of the oscillation state is particularly severe when the light that has been generated is reflected by intermediate optics and returns to the light source. To keep this from happening, an optical isolator is generally provided just in front of the light source, for example.

Optical isolators are made of a Faraday rotator, a polarizer situated on the input side of the Faraday rotator, and an analyzer situated on the output side of the Faraday rotator. The Faraday rotator is used by applying a magnetic field parallel to the propagation direction of light, at which time a polarized component of light, whether traveling forward or backward through the Faraday rotator, rotates only in a fixed direction. In addition, the Faraday rotator is adjusted to a length such that the polarized component of light rotates exactly 45°. When the polarizer and analyzer planes of polarization are offset by 45° in the direction of rotation by forward-traveling light, polarized light traveling forward coincides with the polarizer position and with the analyzer position and thus passes through each. By contrast, polarized light traveling backward from the analyzer position rotates 45° in the opposite direction from the direction of angle offset by the polarizer plane of polarization that is offset 45°. As a result, the returning light has a plane of polarization at the polarizer position that is offset 45°−(−45°)=90° with respect to the polarizer plane of polarization, and thus cannot pass through the polarizer. Hence, the optical isolator functions by allowing forward-traveling light to pass through and exit therefrom and by blocking backward-traveling return light.

Materials hitherto know to be capable of use as the Faraday rotator in optical isolators include TGG crystals ($Tb_3Ga_5O_{12}$) and TSAG crystals ($Tb_{(3-x)}Sc_2Al_3O_{12}$) (JP-A 2011-213552 (Patent Document 1) and JP-A 2002-293693 (Patent Document 2)). TGG crystals have a relatively large Verdet constant of 40 rad/(T·m) (i.e. 0.14 minutes/(Oe·cm)), and today are widely used in standard fiber laser systems. TSAG crystals have a Verdet constant which is reportedly about 1.3 times that of TGG crystals (i.e. approximately 0.18 minutes/(Oe·cm)) and is likewise a material used in fiber laser systems.

In addition, JP-A 2010-285299 (Patent Document 3) discloses a single crystal or ceramic composed primarily of the oxide $(Tb_xR_{1-x})_2O_3$, wherein $0.4 \leq x \leq 1.0$ and R is selected from the group consisting of scandium, yttrium lanthanum, europium, gadolinium, ytterbium, holmium and lutetium. Oxides composed of these constituents have a Verdet constant of 0.18 min/(Oe·cm) or more, with the largest Verdet constant mentioned in the examples provided therein being 0.33 min/(Oe·cm). The same document also mentions, in the text thereof, a Verdet constant for TGG of 0.13 min/(Oe·cm). Hence, the difference between the Verdet constants for both is 2.5-fold.

An oxide composed of substantially similar components is disclosed in JP-A 2011-121837 (Patent Document 4) as well, where it is mentioned that this oxide has a larger Verdet constant than a TGG single crystal.

When, as in Patent Documents 3 and 4 above, an optical isolator having a large Verdet constant is obtained, the total length required for 45° rotation can be shortened, which is desirable in that it makes a smaller optical isolator possible.

Although the $(Tb_xR_{1-x})_2O_3$ oxides disclosed in Patent Documents 3 and 4 do indeed have very large Verdet constants which are 1.4 to 2.5 times as large as those of the TGG crystals disclosed in Patent Document 1 and the TGG crystals mentioned in the text of Patent Document 3, these oxides end up slightly absorbing fiber laser light in the wavelength range of 0.9 to 1.1 μm where they are expected to be used. With fiber lasers in recent years becoming increasingly high-powered, even when a laser is equipped with an optical isolator having only slight absorption, this leads to deterioration in beam quality on account of a thermal lens effect.

Likewise, one material that has a very large Verdet constant per unit length is iron (Fe)-containing yttrium iron garnet (YIG) single crystals (JP-A 2000-266947 (Patent Document 5)). However, iron has a large light absorption at a wavelength of 0.9 μm, which absorption affects optical isolators used in the wavelength range of 0.9 to 1.1 μm. This makes optical isolators that use such yttrium iron garnet single crystals very difficult to employ in fiber laser systems where the trend is clearly toward higher power levels.

It is brown to those skilled in the art that the garnet-type oxides, to which TGG crystal ($Tb_3Ga_5O_{12}$) and TSAG crystal ($(Tb_{(3-x)}Sc_x)Sc_2Al_3O_{12}$) belong, are apt to form crystal phases other than a garnet structure if formulation ratios of elements deviate from stoichiometric ratios. Thus, a problem is presented in that the abrupt lowering of translucency and the lowering of yield occur due to the composition deviation in the course of the formulation of starting materials.

As a substitute for these existing materials, mention is made of oxides having a pyrochlore-type crystal structure. Pyrochlore-type crystals which have an $A_2B_2O_7$ crystal structure and for which the ratio between the radii of A ions and B ions falls within a fixed range are known to have a cubic structure. Being able to select a material having a crystal structure that is cubic would make it possible to produce a material which, not only as a single crystal, but even as a ceramic body, has a high transparency and thus could be employed as various types of optical materials.

JP-A 2005-330133 (Patent Document 6) discloses, as examples of such pyrochlore-type materials, cubic titanium oxide pyrochlore sintered bodies characterized in that they are formed by sintering an electron-conducting ceramic powder which is, of the cubic titanium oxide pyrochlores having a rare-earth element RE at the A sites, a complex oxide $RE_{2-x}Ti_2O_{7-\delta}$ wherein the element RE at the A sites is one, two or more of the elements lutetium, ytterbium, thulium, erbium, holmium, yttrium, scandium, dysprosium, terbium gadolinium, europium, samarium and cerium, and which has a non-stoichiometric amount x of the A-site element RE set within the range

according to the A-site element RE, and subsequently subjecting the sintered powder to reduction treatment. Because the intended application for this art is an electron-conducting ceramic, no mention is made of the transparency of this sintered body. It is known, among those skilled in the art, that normal sintering alone usually yields an opaque sintered body, and so the materials described in Patent Document 6 presumably cannot be used in optical material applications. However, the fact that terbium-containing titanium oxide pyrochlore can have a cubic crystal structure has been disclosed in this publication (Patent Document 6).

Yet, it was separately blown before this that a cubic crystal structure is not possible in a simply terbium-doped silicon oxide (see "Rare earth disilicates $R_2Si_2O_7$ (R=Gd, Tb, Dy, Ho): type B," Z., Kristallogr., Vol. 218, No. 12, 795-801 (2003) (Non-Patent Document 1)).

Also, the fact that certain rare earth-hafnium oxides, although containing no terbium whatsoever, assume a cubic pyrochlore structure and have translucency was disclosed at about the same time ("Fabrication of transparent $La_2Hf_2O_7$ ceramics from combustion synthesized powders," Mat Res. 40(3), 553-559 (2005) (Non-Patent Document 2)).

In addition, JP-A 2010-241677 (Patent Document 7) discloses an optical ceramic which is a polycrystalline, transparent optical ceramic wherein at least 95 wt %, and preferably at least 98 wt %, of the individual crystals have a cubic pyrochlore or fluorite structure and which contains the stoichiometric compound.

$$A_{2+x}B_yD_zE_7$$

Here, when $-1.15 \leq x \leq 0$, $0 \leq y \leq 3$ and $0 \leq z \leq 1.6$, $3x+4y+5z=8$. Also, A is at least one trivalent cation selected from the group of rare-earth metal oxides, B is at least one tetravalent cation, D is at least one pentavalent cation, and E is at least one divalent anion. In this optical ceramic, A is selected from among yttrium, gadolinium, ytterbium, lutetium, scandium and lanthanum and B is selected from among titanium, zirconium, hafnium tin and germanium. This publication confirms that, in spite of containing no terbium whatsoever, titanium oxide, zirconium oxide, hafnium oxide, tin oxide and germanium oxide containing several types of rare earths can form an at least 98 wt % cubic pyrochlore structure.

It is declared that if the pyrochlore oxide is such that the formulation ratio between the A ion and the B ion deviates from the stoichiometric ratio of 1:1 enough to enable an ideal pyrochlore structure to be formed the formation of a cubic pyrochlore phase is allowed within a certain range. Thus, it is assumed that there can be suppressed an abrupt lowering of translucency and a lowering of yield due to a composition deviation during the formulation of starting materials as experienced when using garnet type oxides ("Phase equilibria in the refractory oxide systems of zirconia, hafnia and yttria with rare-earth oxides," J. Eur. Ceram. Soc., 28, 2363-2388 (2008) (Non-Patent Document 3). "Stuffed rare earth pyrochlore solid solutions." J. solid state chem., 179, 3126-3135 (2006) (Non-Patent Document 4)).

In this regard, however, known information has never been found in which while maintaining a cubic structure made of a pyrochlore-type oxide and containing a Tb ion, the formulation ratio between the A ion and the B ion is positively forced to deviate from the stoichiometric ratio to study a magneto-optical material having higher transparency and thus capable of being used for a high output laser.

PRIOR ART DOCUMENTS

Patent Documents

Patent Document 1: JP-A 2011-713552
Patent Document 2: JP-A 2002-293693
Patent Document 3: JP-A 2010-285299
Patent Document 4: JP-A 2011-121837
Patent Document 5: JP-A 2000-266947
Patent Document 6: JP-A 2005-330133
Patent Document 7: JP-A 2010-241677

Non-Patent Documents

Non-Patent Document 1: "Rare earth disilicates $R_2Si_2O_7$ (R=Gd, Tb, Dy, Ho): type B," Z., Kristallogr., Vol. 218, No, 12, 795-801 (2003)
Non-Patent Document 2: "Fabrication of transparent $La_2Hf_2O_7$ ceramics from combustion synthesized powders," Mat Res. Bull., 40(3), 553-559 (2005)
Non-Patent Document 3: "Phase equilibria in the refractory oxide systems of zirconia, hafnia and yttria with rare-earth oxides," J. Eur. Ceram. Soc., 28, 2363-2388 (2008)
Non-Patent Document 4: "Stuffed rare earth pyrochlore solid solutions," J. solid state chem., 179, 3126-3135 (2006)

SUMMARY OF THE INVENTION

Problems to be Solved by the Invention

The present invention has been made under such circumstances as stated above and has for its object the provision of a transparent magneto-optical material suited for configuring a magneto-optical device such as an optical isolator that does not absorb fiber laser light in the wavelength range of 0.9 to 1.1 μm and thus suppresses the generation of a thermal lens and a method for producing the same, and also of a magneto-optical device.

Means for Solving the Problems

Based on the knowledge of the prior art stated above, the present inventors have made studies on a diversity of Tb-containing pyrochlore materials as a completely novel candidate which is less likely to absorb fiber laser light in the wavelength range of 0.9 to 1.1 μm than $(Tb_xR_{1-x})_2O_3$ oxide ceramics and is applicable for high-power laser use thereby completing a magneto-optical material suited to configure a magneto-optical device such as an optical isolator and also a magneto-optical device.

More particularly, the invention contemplates to provide the following magneto-optical material and its production method, and also a magneto-optical device.

[1] A magneto-optical material, characterized by comprising a transparent ceramic containing as a main component a complex oxide represented by the following formula (1), or comprising a single crystal of a complex oxide represented by the following formula (1)

$$Tb_{2x}R_{2(2-x)}O_{8-x} \qquad (1)$$

(wherein $0.800 < x < 1.00$, and R represents at least one element selected from the group consisting of silicon, germanium titanium, tantalum, tin, hafnium and zirconium (but not silicon alone, germanium alone or tantalum alone)).

[2] The magneto-optical material of [1] which is characterized in that when laser light having a wavelength of 1,064 nm is input thereto at a beam diameter of 1.6 mm, for an optical path length of 10 mm, the maximum input power of laser light which does not generate a thermal lens is 30 W or more.

[3] The magneto-optical material of [1] or [2] which, for an optical path length of 10 min, has a linear transmittance of light at a wavelength of 1,064 nm that is at least 90%.

[4] The magneto-optical material of any of [1] to [3], which has a main phase comprising a cubic crystal having a pyrochlore lattice.

[5] A method for producing a magneto-optical material, comprising the steps of: firing terbium oxide powder and at least one oxide powder selected from the group consisting of silicon oxide, germanium oxide, titanium oxide, tantalum oxide, tin oxide, hafnium oxide and zirconium oxide (but not silicon oxide alone, germanium oxide alone or tantalum oxide alone) in a crucible to prepare a fired starting material containing, as a main component, a cubic pyrochlore-type oxide; pulverizing the fired starting material to form a starting powder; forming the starting powder to a predetermined shape and then sintering, the formed powder; and subsequently hot isostatic pressing so as to obtain a transparent ceramic sintered body containing as a main component a complex oxide represented by the following formula (1)

$$Tb_{2x}R_{2(2-x)}O_{8-x} \qquad (1)$$

(wherein $0.800 < x < 1.00$, and R represents at least one element selected from the group consisting of silicon, germanium titanium, tantalum, tin, hafnium and zirconium (but not silicon alone, germanium alone or tantalum alone)).

[6] The method for producing a magneto-optical material of [5] wherein the fired starting material is prepared by weighing out the terbium oxide powder and the at least one oxide powder selected from the group consisting of silicon oxide, germanium oxide, titanium oxide, tantalum oxide, tin oxide, hafnium oxide and zirconium oxide so that a molar ratio of the terbium atom to the at least one atom selected from the group consisting of silicon, germanium, titanium, tantalum, tin, hafnium and zirconium is x:(2−x) (wherein x is larger than 0.800 and less than 1.00), mixing the powders and then firing the mixed powders.

[7] A magneto-optical device which is constructed using the magneto-optical material of any one of [1] to [4].

[8] The magneto-optical device of [7], Wherein the device is an optical isolator that comprises the magneto-optical material as a Faraday rotator and polarizing materials provided at front and back sides of the Faraday rotator on an optical axis thereof, and that can be used in a wavelength range of at least 0.9 µm and 1.1 µm or less.

[9] The magneto-optical device of [8], wherein the Faraday rotator has an antireflection coating on an optical surface thereof.

Advantageous Effects of the Invention

According to the invention, there can be provided transparent magneto-optical materials which are suitable for constructing magneto-optical devices such as optical isolators wherein the material is larger in the maximum input power of laser light which does not generate a thermal lens than the oxide of $(Tb_xR_{1-x})_2O_3$ and is not deteriorated with respect to the beam quality even when mounted on a fiber laser system having a wavelength range of 0.9 to 1.1 µm.

EMBODIMENT FOR CARRYING OUT THE INVENTION

Figure 1:
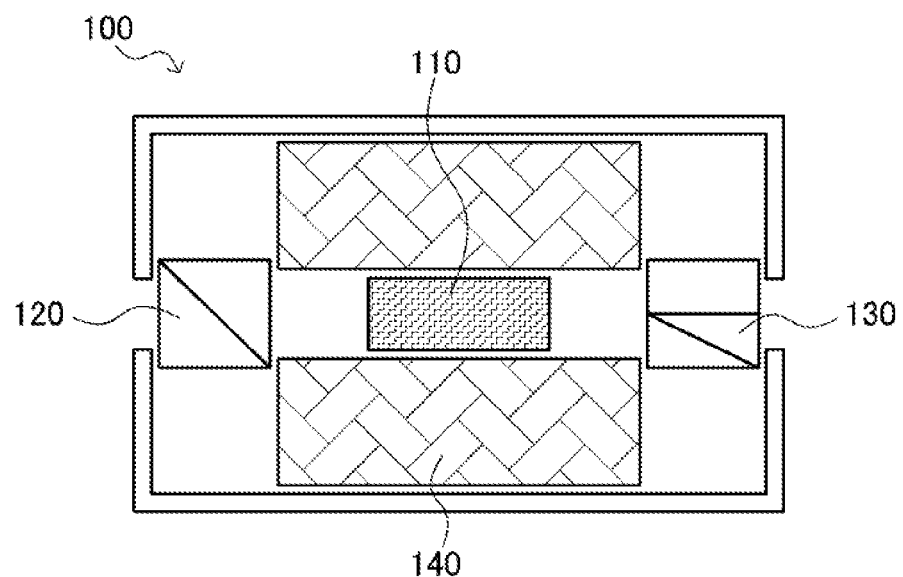
FIG. 1 is a schematic cross-sectional view showing an example of an optical isolator in which the magneto-optical material of the invention is used as a Faraday rotator.

[Magneto-Optical Material]
The magneto-optical material of the invention is described below.

The magneto-optical material of the invention is characterized by composing transparent ceramic containing as a main component a complex oxide of formula (1) below, or comprising a single crystal of a complex oxide a formula (1) below

$$Tb_{2x}R_{2(2-x)}O_{8-x} \qquad (1)$$

(wherein $0.800 < x < 1.00$, and R represents at least one element selected from the group consisting of silicon, germanium, titanium, tantalum, tin, hafnium and zirconium (but not silicon alone, germanium alone or tantalum alone)).

Terbium (Tb) has, with the exception of iron (Fe), the largest Verdet constant of the paramagnetic elements, and moreover is transparent at a wavelength of 1.06 µm (linear transmittance of light for an optical path length of 1 mm, ≥80%). It is therefore the element best suited for use in optical isolators in this wavelength region. However, to take full advantage of such transparency, terbium cannot be in a metallically bonded state and must be rendered into the state of a stable compound.

The most typical example that forms stable compounds is exemplified by oxides. Of these, because certain types of materials having a pyrochlore-type structure (complex oxides) assume a cubic structure (this being referred to here as a "cubic structure having a pyrochlore lattice (pyrochlore-type cubic structure)," highly transparent compounds that do not cause anisotropic scattering can be obtained. Therefore, compounds which are pyrochlore-type oxides composed of a system having terbium at the A sites and which is assume a cubic structure (terbium-containing cubic system pyrochlore-type oxides) are preferred as materials for use in optical isolators at a wavelength range of at least 0.9 µm and 1.1 µm or less, and more specifically, 1,064±40 nm.

Preferred use can be made of silicon, germanium, titanium, tantalum, tin, hafnium or zirconium as the B-site element for obtaining a cubic structure.

However, because the ionic radii of silicon and germanium are too small, filling the B-sites with these elements alone is undesirable because the crystal structure may become orthorhombic, interfering with the transparency. Hence, when silicon or germanium is selected, this is used in combination with another element having a larger ionic radius—namely, zirconium.

As a result, the magneto-optical material of the invention preferably includes, as a main phase, a cubic structure having a pyrochlore lattice (pyrochlore-type cubic structure), and more preferably consists essentially of a pyrochlore-type cubic structure. Here, to include "as a main phase" means that a pyrochlore-type cubic structure accounts for at least 90 vol %, and preferably at least 95 vol %, of the overall crystal structure. Alternatively, it means that the pyrochlore transformation ratio, as calculated from powder x-ray diffraction results for this magneto-optical material, is at least 51.5% when R in above formula (1) is zirconium alone, and is at least 97.3%, and preferably at least 99%, when R is something else (that is, when R is at least one element selected from the group consisting of silicon, germanium, titanium, tantalum tin, hafnium and zirconium (but is not silicon alone, germanium alone, tantalum alone or zirconium alone)).

The "pyrochlore transformation ratio" is the molar fraction of an ideal pyrochlore-type cubic structure in a target material, as determined from the position at the peak corresponding to the (622) plane of cubic crystals in a powder x-ray diffraction pattern of the target material (the 2θ value $P_{(622)}$ by using the 2.0 value for the (622) plane of terbium oxide based on Vegard's rule ($P_{Tbr}$) and the 2θ value of the (622) plane when the target material is treated as an ideal pyrochlore-type cubic structure ($P_{TbR}$). The (622) plane is the diffraction plane on the highest angle side of the four main diffraction planes in the x-ray diffraction pattern of pyrochlore-type cubic crystals.

Formula (1) includes terbium and R, which is at least one element selected from the group consisting of silicon, germanium, titanium tantalum, tin, hafnium and zirconium (but is not silicon alone, germanium alone or tantalum alone), and may include also other elements as well. Typical examples of the other elements include rare-earth elements such as lanthanum, gadolinium, thulium, cerium, praseodymium, ytterbium and dysprosium, and various impurities such as calcium, aluminum, phosphorus, tungsten and molybdenum.

The content of such other elements, based on a value of 100 for the total amount of terbium, is preferably not more than 10, more preferably not more than 1, even more preferably not more than 0.1, and most preferably not more than 0.001 (essentially zero).

The ratio of the moles of terbium and the moles of R in the formula (1) (the molar ratio of terbium to R (Tb:R) is at larger than 1.60:2.40 to less than 2.00:2.00, preferably at least 1.80:2.20 to less than 2.00:2.00, more preferably at least 1.90:2.10 to less than 2.00:2.00, and much more preferably at least 1.90:2.10 to up to 1,998:2.002.

Correspondingly, x in the formula (1) is at larger than 0.800 to less than 1.00, preferably at least 0.900 to less than 1.00, more preferably at least 0.950 to less than 1.00 and much more preferably at least 0.950 to up to 0.999. Where x is within the range indicated above, an R ion predominantly occupies the B site with the result that a Tb ion efficiently occupies the A site thereby improving the valence (trivalent) stability of Tb to increase translucency. However, if x is up to 0.800, the pyrochlore-type cubic crystal does not exhibit a main phase. Further, a mixed crystal results to cause birefringence, so that translucency unfavorably lowers considerably.

The magneto-optical material of the invention includes, as a main component, a complex oxide of formula (1) above. That is, so long as the magneto-optical material of the invention includes a complex oxide of formula (1) as the main component, other ingredients may be intentionally included therein as secondary ingredients.

Here, "includes as a main component" means to include at least 50 wt % of the complex oxide of formula (1). The content of the complex oxide of formula (1) is preferably at least 80 wt %, more preferably at least 90 wt %, even more preferably at least 99 wt %, and most preferably at least 99.9 wt %.

Common examples of such secondary ingredients (ingredients other than the main component) include dopants which are added during single crystal growth, fluxes, and sintering aids which are added during ceramic production.

Methods for producing the magneto-optical material of the invention include single crystal production methods such as the floating zone method and micro-pulling-down, and also ceramic production methods. Although any of these methods may be used, generally, in single crystal production, there are certain constraints on deign of the concentration ratios in a solid solution. Hence, ceramic production methods are more preferred in this invention.

Ceramic production methods are described in greater detail below as examples of methods for producing the magneto-optical material of the invention, although single crystal production methods in keeping with the technical ideas of this invention are not excluded.

<<Ceramic Production Method>>

[Starting Materials]

Starting materials suitable for use in this invention include powders, or nitric acid, sulfuric acid, uric acid or other aqueous solutions, of the metals serving as constituent elements of the inventive magneto-optical material which is composed of terbium and the element R (R being at least one element selected from the group consisting of silicon, germanium, titanium, tantalum, tin, hafnium and zirconium (but not silicon alone, germanium alone or tantalum alone)). Alternatively, oxide powders of the above elements may be suitably used as the starting materials.

These are weighed out in given amounts to a molar ratio of terbium to R of x:(2−x) (wherein x is larger than 0.800 but less than 1.00), mixed together and fired so as to obtain a fired starting material having as a main component a cubic pyrochlore-type oxide of the desired composition. For example, a terbium oxide powder and the at least one oxide powder selected from the group consisting of silicon oxide, germanium oxide, titanium oxide, tantalum oxide, tin oxide, hafnium oxide and zirconium oxide (but not silicon oxide alone, germanium oxide alone or tantalum oxide alone) may be weighed out in given amounts to a molar ratio of the terbium atom to the at least one atom selected from the group consisting of silicon, germanium, titanium, tantalum, tin, hafnium and zirconium of x:(2−x) (wherein x is larger than 0.800 and less than 1.00), mixed together and then fired in a crucible. At this time, where there are selected oxide powders of a plurality of elements R selected from the group consisting of silicon, germanium titanium, tantalum, tin, hafnium and zirconium, it is preferred to weigh such that molar ratio of the R atoms is divided into equal ratios. For instance, where two types of oxide powders of elements $R_1$ and $R_2$ are selected, they should be so weighed that the molar ratio of $R_1:R_2$ is at 1:1.

The firing temperature at this time is preferably at least 1,200° C. and lower than the temperature in subsequent sintering, and more preferably at least 1,400° C. and lower than the temperature in subsequent sintering.

Here, "having as a main component" means that a major proportion of the fired starting material (e.g. at least 50% on a volume ratio basis) is occupied by the oxide with a pyrochlore-type crystal structure. Alternatively, it also means that the above-described pyrochlore transformation ratio computed from the powder x-ray diffraction results for the fired starting material is at least 41.5% when R in formula (1) is zirconium alone, and is at least 50%, and preferably at least 55%, when R is something else (that is, when R is at least one element selected from the group consisting of silicon, germanium, titanium, tantalum, tin, hafnium or zirconium (but is not silicon alone, germanium alone, tantalum alone or zirconium alone).

These starting materials have purities of preferably at least 99.9 wt %. Next, the fired starting material thus obtained is pulverized to form a starting powder.

Ceramic production is ultimately carried out using a pyrochlore-type oxide powder of the desired composition, but the shape of the powder at that time is not particularly limited. For example, suitable use may be made of angular, spherical or lamellar powders. Alternatively, secondary agglomerated powders may be suitably used, or granular powders obtained by granulating treatment such as spray drying may be suitably used. The processes used to prepare such starting powders are not particularly limited. Starting powders produced by co-precipitation, a pulverizing method, spray pyrolysis, the sol-gel method, alkoxide hydrolysis a complex polymerization method and various other methods of synthesis may be suitably used. The resulting starting powders may be suitably treated in, for example, a wet ball mill, bead mill or jet mill, or a dry jet null or hammer mill.

A suitable sintering inhibitor (sintering aid) may be added to the pyrochlore-type oxide powder starting material used in this invention. To obtain a particularly high transparency, it is preferable to add a sintering inhibitor that is suitable for terbium-containing pyrochlore-type oxides. The purity thereof is preferably at least 99.9 wt %. When a sintering inhibitor is not added, it is desirable to select, as the starting powder to be used, one in which the primary particles are nanosized and which has a very high sintering activity. Such selection may be made as appropriate.

Various types organic additives are sometimes added for stability of quality and improved yield in the production process. These are not particularly limited in the invention. Preferred use can be made of, for example, various types of dispersants, binders, lubricants and plasticizers.

[Production Process]

In this invention, the starting powder is pressed into a predetermined shape, after which debinding is carried out. The powder is then sintered, thereby producing a sintered body that has been densified to a relative density of not less than 95%. Hot isostatic pressing (HIP) is preferably carried out in a subsequent step.

(Forming)

An ordinary press forming step may be suitably used in the production method of the invention. That is, a very common pressing be used, such as one in which the starting powder is filled into a die and pressure is applied from a fixed direction, or a cold isostatic pressing (CIP) step in which the starting powder is placed and sealed within a deformable waterproof container and hydrostatic pressure is applied. The applied pressure may be suitably adjusted while checking the relative density of the compact obtained and is not particularly limited, although production costs can be held down by controlling the applied pressure within the pressure range of up to about 300 MPa that commercial CIP equipment is capable of handling. Alternatively, suitable use may be made of, for example, a hot pressing step or a spark plasma sintering step which, during forming, not only carries out a forming step but also proceeds without interruption to sintering, or a microwave heating step. Moreover, there can also be used, aside from the press forming methods, a cast molding method wherein a starting powder is dispersed in water and an organic solvent, cast into a mold and formed. The manner of cast molding is not specifically limited, and a compression casting method, a reduced pressure casting method, a solid casting method, and a centrifugal casting method may be conveniently used. On this occasion, dispersants and binders may be appropriately added for the purposes of improving the fluidity of shiny and the shape retentivity of a molded body.

(Debinding)

An ordinary debinding step may be suitably used in the production method a the invention. That is, production may proceed via a debinding step at an elevated temperature within a heating furnace. The type of atmospheric gas used at this time is not particularly limited; for example, suitable use may be made of air, oxygen, hydrogen or the like. The debinding temperature also is not particularly limited, although when using a starting material having organic additives mixed therein, it is preferable to raise the temperature to a level at which the organic ingredients can be decomposed and eliminated.

(Sintering)

An ordinary sintering step may be suitably used in the production method of the invention. That is, a heat sintering step that entails resistance heating, induction heating or the like may be suitably used. The atmosphere at this time is not particularly limited, although suitable use may be made of, for example, inert gas, oxygen, hydrogen or the like. Alternatively, sintering may be carried out under reduced pressure (in a vacuum).

The sintering temperature in the sintering step of the invention is suitably adjusted according to the starting materials selected for use. Generally, it is preferable to choose a temperature which is from several tens of degrees Celsius to about 100° C. to 200° C. lower than the melting point of the terbium-containing pyrochlore-type oxide sintered body to be produced using the starting materials that have been selected. When a terbium-containing pyrochlore-type oxide sintered body is to be produced for which there exists, near the chosen temperature, a temperature region at which a phase change to a phase that is other than cubic occurs, sintering under strict control to ensure that the temperature remains outside of such a temperature region provides the advantage of making it possible to inhibit the admixture of other than cubic phases and to reduce scattering due to birefringence.

The sintering hold time in this sintering step of the invention is suitably adjusted according to the starting materials that are selected. In general, a sintering hold time of about several hours is usually sufficient. However, densification to a relative density in the terbium-containing pyrochlore-type oxide sintered body of not less than 95% is essential.

(Hot Isostatic Pressing (HIP))

In the production method of the invention, after passing through the sintering step, a step in which hot isostatic pressing (HIP) is carried out may be additionally provided.

The pressurizing gas medium used at this time is preferably an inert gas such as argon or nitrogen, or may be $Ar-O_2$. The pressure applied by the pressurizing gas medium is preferably between 50 and 300 MPa, and more preferably between 100 and 300 MPa. At below 50 MPa, a transparency improving effect may not be obtained, whereas increasing the pressure to above 300 MPa does not yield a higher improvement in transparency and places an excessive load on the equipment, which may lead to equipment damage. It is convenient and thus desirable for the applied pressure to be 196 MPa or below, at which pressure treatment can be carried out in a commercial HIP apparatus.

The treatment temperature at this time (specific holding temperature) should be suitably set according to the type of material and/or the sintered state. For example, this may be set in the range of 1,000 to 2,000° C., and preferably 1,300 to 1,800° C. As in the sintering step, it is critical for the treatment temperature here to be set no higher than the melting point and/or no higher than the phase transition temperature of the terbium-containing pyrochlore-type oxide making up the sintered body. At a heat treatment temperature above 2,000° C., the terbium-containing pyrochlore-type oxide sintered body anticipated in this invention ends up either exceeding the melting point or exceeding the phase transition point, making it difficult to carry out proper HIP treatment. On the other hand, at a heat treatment temperature below 1,000° C., a sintered body transparency improving effect is not obtained. The heat treatment temperature holding time, although not particularly limited, should be suitably adjusted while ascertaining the properties of the terbium-containing pyrochlore-type oxide making up the sintered body.

The heater material, heat-insulating material and treatment vessel used to carry out HIP treatment are not particularly limited, although preferred use may be made of graphite, molybdenum (Mo) or tungsten (W).

(Annealing)

In the manufacturing method of the invention, following the completion of HIP treatment, in some cases, oxygen, defects arise in the resulting terbium-containing pyrochlore-type oxide sintered body and the sintered body exhibits a light gray-colored appearance. When this happens, it is preferable to carry out slight-oxidation annealing treatment at a temperature up to the HIP treatment temperature (e.g. 1,100° C. to 1,500° C.) and under conditions equal to the HIP treatment pressure. When doing so, carrying out slight-oxidation annealing using the same equipment as in HIP treatment is desirable in that it simplifies the manufacturing process. By means of such annealing treatment, even those terbium-containing pyrochlore-type oxide sintered bodies which exhibit a light gray-colored appearance can all be rendered into clear, colorless ceramic bodies.

(Optical Polishing)

In the production method of the invention, it is preferable for the terbium-containing pyrochlore-type oxide sintered body (i.e., transparent ceramic) obtained by the above series of production steps to be optically polished at both endfaces on the axis thereof that is to be optically used. The optical surface accuracy at this time, for a measurement wavelength λ633 nm, is preferably λ/8 or below, and more preferably λ/10 or below. Optical loss may be further reduced by suitably forming an antireflective coating on the optically polished surface.

A magneto-optical material in which the generation of a thermal lens is suppressed can thereby be obtained. When laser light having a wavelength of 1,064 mm is input to the magneto-optical material of the invention over an optical path length of 10 mm and at a beam diameter of 1.6 mm, the maximum input power of laser light that does not generate a thermal lens is preferably 30 W or more, and more preferably 80 W or more. At a thermal lens-free maximum input power below 30 W, use of the inventive magneto-optical material in a high-power fiber laser system may be difficult. The magneto-optical material of the invention preferably has, for an optical path length of 10 min, an in-line transmittance in light transmission at a wavelength of 1,064 iron that is 90% or more. In this invention, "linear transmittance" refers to the linear transmittance when the transmission spectrum measured in a blank (space) state, that is, without placing a sample in the measurement light path, is set to 100%.

[Magneto-Optical Device]

The magneto-optical material of the invention is suitable for magneto-optical device applications, and is particularly well-suited for use as a Faraday rotator in, an optical isolator that operates at wavelengths of between 0.9 and 1.1 μm.

FIG. 1 is a schematic cross-sectional diagram showing an example of an optical isolator which is an optical device that includes, as an optical element, a Faraday rotator made of the magneto-optical material of the invention. In FIG. 1, an optical isolator 100 is provided with a Faraday rotator 110 made of the magneto-optical material of the invention. A polarizer 120 and an analyzer 130, which are polarizing materials, are provided before and after the Faraday rotator 110. In the optical isolator 100, it is preferable for the polarizer 120, the Faraday rotator 110 and the analyzer 130 to be arranged in this order and for a magnet 140 to be mounted on at least one surface of the sidewalls thereof.

This optical isolator 100 can be suitably used in industrial fiber laser systems. That is, it is suitable for preventing laser light that has been emitted by a laser light source and is reflected from returning to the light source and destabilizing oscillation.

EXAMPLES

The present invention is more particularly described by way of Examples, Comparative Examples and Reference Examples. The present invention should not be construed as limited to the following Examples.

Example 1, Comparative Example 1, and Reference Example 1

Examples are described here in which hafnium tin or titanium was selected as a single element to fill the B site positions (i.e., R in above formula. (1)) and x is changed in formula (1).

Terbium oxide powder produced by Shin-Etsu Chemical Co., Ltd., hafnium oxide powder produced by Alfa Aesar, and stannic oxide powder and titanium oxide powder both produced by Kojyundo Chemical Laboratory Co., Ltd., were obtained. The purities were all at least 99.9 wt %.

Using the above raw materials, there were prepared a total of 13 types (1 composition×7x-levels+2 compositions 3x-levels) of mixed oxide raw materials having mixing ratios sufficient to provide final formulations indicated in Table 1. More particularly, there were provided mixed powders obtained by weighing out terbium oxide and hafnium oxide so that the relationship between the moles of terbium and the moles of hafnium were at x=0.700, 0.800, 0.900, 0.950, 0.990, 0.999 and 1.00, and also mixed powders obtained by weighing out terbium oxide and tin or titanium oxide so that the in relationship between the moles of terbium and the moles of tin or titanium were at x=0.700, 0.900 and 1.00 (i.e. mixed powders made of $Tb_{1.40}Hf_{2.60}O_{7.30}$, $Tb_{1.60}Hf_{2.40}O_{7.20}$, $Tb_{1.80}Hf_{2.20}O_{7.10}$, $Tb_{1.90}Hf_{2.10}O_{7.05}$, $Tb_{1.98}Hf_{2.02}O_{7.01}$, $Tb_{1.998}Hf_{2.002}O_{7.001}$, $Tb_{2.00}Hf_{2.00}O_{7.00}$, $Tb_{1.40}Sn_{2.60}O_{7.30}$, $Tb_{1.80}Sn_{2.20}O_{7.10}$, $Tb_{2.00}Sn_{2.00}O_{7.00}$, $Tb_{1.40}Ti_{2.60}O_{7.30}$, $Tb_{1.80}Ti_{2.20}O_{7.10}$, $Tb_{2.00}Ti_{2.00}O_{7.00}$). That is, 13 mixed powders were prepared: mixed powders obtained by weighing out terbium oxide and hafnium oxide so that terbium and hafnium are in appropriate molar ratios, respectively, mixed powders obtained by weighing out terbium oxide and stannic oxide so that terbium and tin are in appropriate molar ratios, respectively, and mixed powders obtained by weighing out terbium oxide and titanium oxide so that terbium and titanium are in appropriate molar ratios, respectively. Next, the respective mixed powders were dispersed and mixed in ethanol within a zirconia ball mill while being careful to prevent contamination between the different powders. The treatment time was 24 hours. This was followed by spray-drying treatment, thereby producing granular starting materials, all of which had an average particle size of 20 μm.

Next, these powders were placed in an iridium crucible and fired in a high-temperature muffle furnace at 1,400° C. for a holding time of 3 hours, giving fired starting materials of the respective compositions. Each of the resulting fired materials was subjected to diffraction pattern analysis with a powder x-ray diffractometer from PANalytical B.V. The crystal systems of the samples were identified from these peaks. The case that a peak was split by the influence other than those influences of Cu—Kα1 radiation and Cu—Kα2 radiation and a single crystal system could not be determined was judged as a mixed crystal. It will be noted that where the quality of a magneto-optical material is discussed, it suffices that the case that no single crystal system exists is judged as a mixed crystal. Here, an attempt was made to identify phases other than the crystal phase of the pyrochlore-type oxide from the comparison with reference data of X-ray diffraction patterns and also from Rietveld analyses.

As a result, it was confirmed that seven fired materials using Hf as the B site (i.e. R=Hf) ($Tb_{1.40}Hf_{2.60}O_{7.30}$, $Tb_{1.60}Hf_{2.40}O_{7.20}$, $Tb_{1.60}Hf_{2.40}O_{7.20}$, $Tb_{1.80}Hf_{2.20}O_{7.10}$, $Tb_{1.90}Hf_{2.10}O_{7.05}$, $Tb_{1.98}Hf_{2.02}O_{7.01}$, $Tb_{1.998}Hf_{2.002}O_{7.001}$, $Tb_{2.00}Hf_{2.00}O_{7.00}$) had a cubic crystal thought to be a pyrochlore-type oxide or fluorite-type oxide crystal phase. In this regard, however, as to $Tb_{1.60}Hf_{2.40}O_{7.20}$ and $Tb_{1.40}Hf_{2.60}O_{7.30}$, a plurality of cubic fluorite-type oxides having different lattice constants were mixed.

Likewise, three fired material using Sn as the B site (i.e. R=Sn) ($Tb_{1.40}Sn_{2.60}O_{7.30}$, $Tb_{1.80}Sn_{2.20}O_{7.10}$ and $Tb_{2.00}Sn_{2.00}O_{7.00}$) were all confirmed to have a cubic crystal thought to be a pyrochlore-type oxide crystal phase. In this regard, however, although it was confirmed that as to $Tb_{1.40}Sn_{2.60}O_{7.30}$, an XRD diffraction peak of a crystal phase other than a cubic pyrochlore-type oxide was mixed, its identification could not be made because of the absence of reference data.

Finally, three fired materials using Ti as the B site (i.e. R=Ti) ($Tb_{1.40}Ti_{2.60}O_{7.30}$, $Tb_{1.80}Ti_{2.20}O_{7.10}$ and $Tb_{2.00}Ti_{2.00}O_{7.00}$) were all confirmed to have a cubic crystal thought to be a pyrochlore-type oxide crystal phase. In this regard, however, as to $Tb_{1.40}Ti_{2.60}O_{7.30}$, there was mixed an XRD diffraction peak of a fluoride-type oxide phase that was a cubic crystal having a different lattice constant aside from the cubic pyrochlore-type oxide, or a hexagonal crystal structure.

Each of the resulting starting materials was uniaxially pressed, then isostatically pressed at a pressure of 198 MPa to give a CIP compact. The resulting CHIP compact was subjected to 2 hours of debinding treatment at 1,000° C. in a muffle furnace. The dried compact was then loaded into a vacuum furnace and treated at 1,700° C.±20° C. for 3 hours under a reduced pressure of not more than $2.0/10^{-3}$ Pa, thereby giving a total of 13 types (1 composition×7 levels+2 compositions×3 x-levels) of sintered compacts. During this operation, the sintering temperature was finely adjusted so that the relative density of each sample when sintered becomes 95%.

Each of the resulting sintered compacts was charged into a carbon beater-type HIP furnace and HIP treated in argon at 200 MPa and 1,650° C. for 3 hours.

As a Comparative Example, a $Tb_{1.2}Y_{0.8}O_3$ translucent ceramic was prepared by reference to JP-A 2010-285299 (Patent Document 3) (Comparative Example 1-5).

The respective ceramic sintered bodies thus obtained were ground and polished to a diameter of 5 mm and a length of 10 mm, following which both optical endfaces of each sample were given a final optical polish to an optical surface accuracy of HIS (when measured at a wavelength λ=633 nm).

Figure 2:
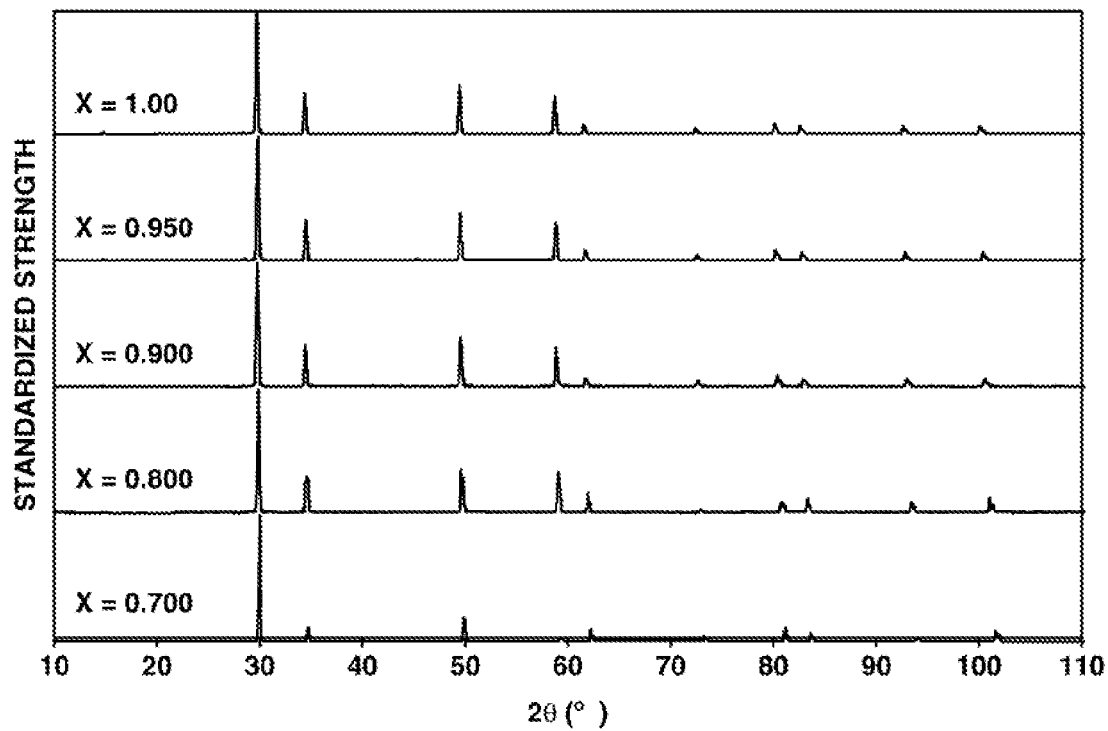
FIG. 2 is X-ray diffraction patterns of ceramic sintered bodies $(T_{2x}Hf_{2(2-x)}O_{8-x})$ of Reference Example 1-1, Examples 1-3 and 1-4, and Comparative Examples 1-1 and 1-2.
Figure 3:
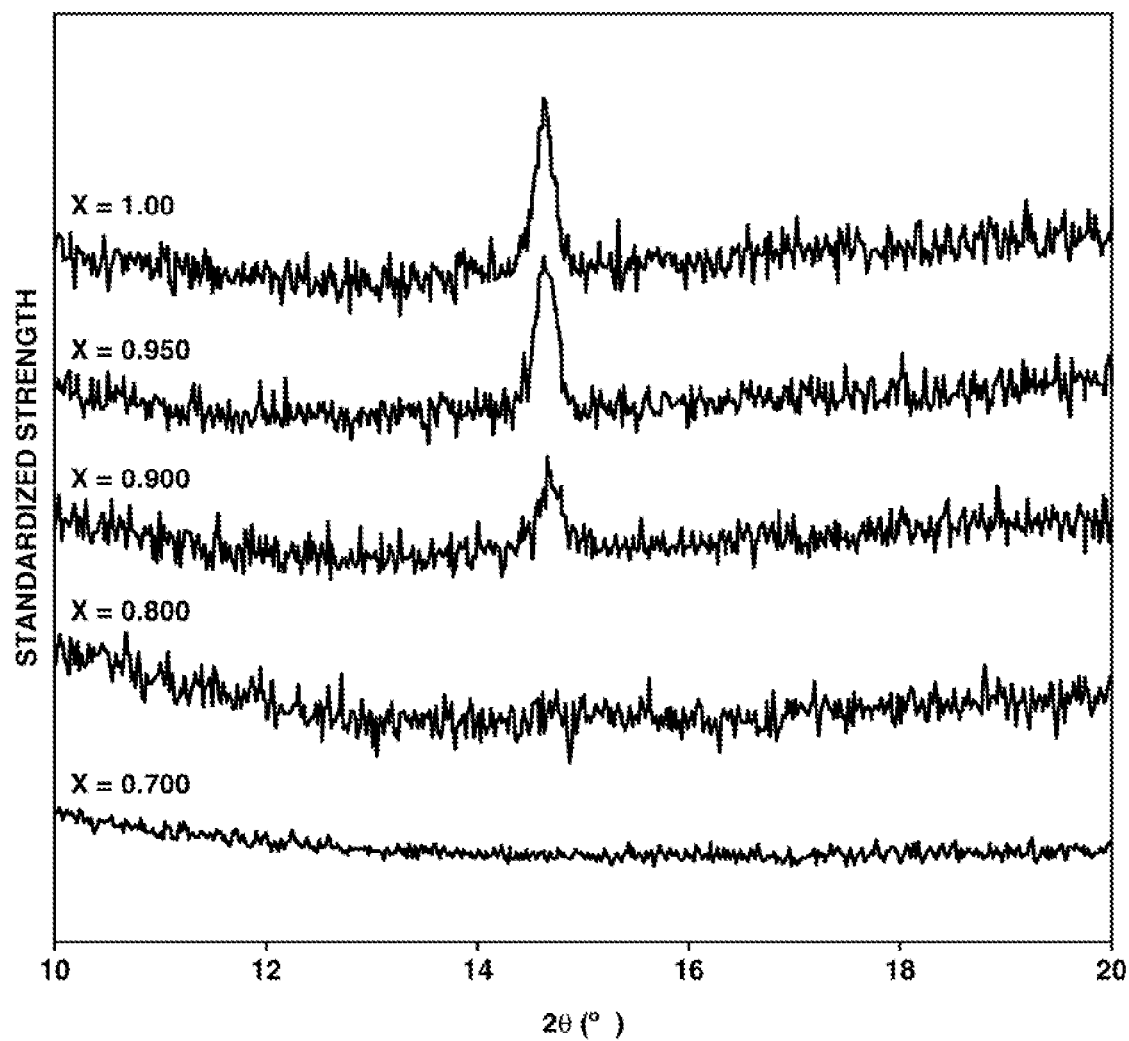
FIG. 3 is an enlarged view of the X-ray diffraction patterns in the vicinity of 2θ=15° of FIG. 2.
Figure 4:
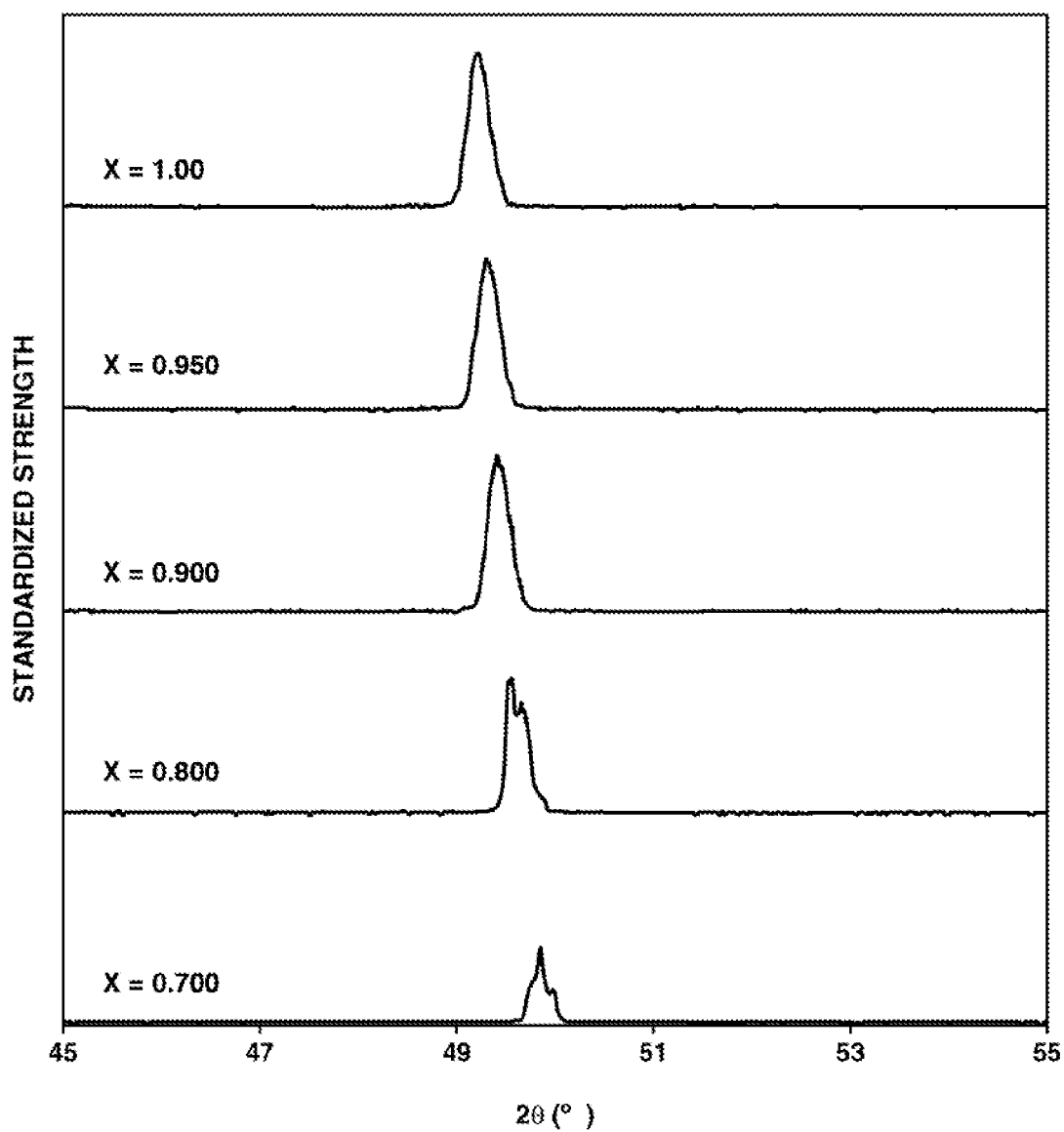
FIG. 4 is an enlarged view of the X-ray diffraction patterns in the vicinity of 2θ=50° of FIG. 2.

Five ceramic sintered bodies of R=Hf and x=0.700, 0.800, 0.900, 0.950 and 1.00 (i.e. $Tb_{1.4}Hf_{2.60}O_{7.30}$, $Tb_{1.60}Hf_{2.40}O_{7.20}$, $Tb_{1.80}Hf_{2.20}O_{7.10}$, $Tb_{1.90}Hf_{2.10}O_{7.05}$, $Tb_{2.00}Hf_{2.00}O_{7.00}$) were subjected to measurement of a diffraction pattern according to an Out-of-plane XRD method using a powder X-ray diffraction device (Smart Lab), manufactured by Rigaku Corporation (FIG. 2). The XRD conditions were such that copper was used as an anode, X-ray was generated at 45 kV and 200 mA and the scanning range was from 10° to 110°. The reflection intensity of the respective ceramic sintered bodies was standardized in terms of reflection strength in the vicinity of 2θ=30° (i.e. a reflection at (222) plane for pyrochlore and (111) plane for fluorite). With x=1.00, the reflection at (111) plane attributed to the cubic pyrochlore structure was observed in the vicinity of 2θ=14.6 (FIG. 3). As x decreased, the reflection intensity at the (111) plane observed in the vicinity of 2θ=14.6° was reduced. With x=0.800 and 0.700, the reflection in the vicinity of 2θ=14.6° disappeared, thus being judged as a diffraction pattern attributed to the cubic fluorite structure. With x=0.800 and 0.700, the reflection (peak pattern) at high angle side was split by the influence other than those of Cu—Kα1 radiation and Cu—Kα2 radiation, thus being judged as attributed to a mixed crystal (FIG. 4).

Optically polished 14 types of samples were all coated with an antireflection coating that was so designed as to have a central wavelength of 1.054 nm. The samples obtained herein were checked with respect to their optical appearance.

The resulting, ceramic samples were subjected to measurement of a linear transmittance in the following way. Moreover, as depicted in FIG. 1, polarizer elements were set at opposite sides of the respective ceramic samples obtained, and this sample was inserted into the center of a neodymium-iron-boron magnet having an outer diameter of 32 mm, an inner diameter of 6 mm, and a length of 40 min. Thereafter, using a high-power laser (beam diameter, 1.6 mm) manufactured by IPG Photonics Japan, high-power laser light having a wavelength of 1,064 nm was input from both endfaces and a Verdet constant and maximum input power that does not generate a thermal lens were measured.

(Method of Measuring Linear Transmittance)

The linear transmittance was determined in accordance with JIS K7361 and HS K7136 by using a light source from NKT Photonics and a power meter and a Ge photodetector from Gentec, and using optics manufactured in-house. The intensity of light transmitted through a sample when 1,064 nm wavelength light is applied at a beam diameter of 1 to 3 ram was measured, and the measured value was inserted into the following formula.

Linear transmittance (%/cm)=$I/Io \times 100$

Here, I is the transmitted light intensity (intensity of linear transmitted light through a sample having a length of 10 mm (1 cm)), and Io is the incident light intensity.

As to the samples whose linear transmittance is 80% or more, the Verdet constant and the maximum input power that does not generate a thermal lens, both described below, were measured. As to the samples whose linear transmittance is less than 80%, the measurement of the Verdet constant and the maximum input power that does not generate a thermal lens was not made (herein and whenever it appears hereinafter).

(Method of Measuring Verdet Constant)

The Verdet constant V was determined based on the following formula. It will be noted that the magnitude of the magnetic field (H) applied to a sample is a value calculated by simulation from the dimension of the measuring system, a residual magnetic flux density (Br) and a retentivity (Hc).

$$\theta = V \times H \times L$$

Here, $\theta$ is the Faraday rotation angle (minutes), V is the Verdet constant, H is the magnitude of the magnetic field (Oe), and L is the length of the Faraday rotator (in this case, 1 cm).

It will be noted that as to the Verdet constant of $Tb_{1.2}Y_{0.8}O_3$ of Comparative Example 1-5, reference is made to the Document data (JP-A 2010-285299 (Patent Document 3)).

(Method of Measuring Maximum Input Power of Laser Light which does not Generate a Thermal Lens)

Initially, high-power laser fight with a wavelength of 1,064 nm was outputted in the form of spatial light with a beam diameter of 1.6 mm in a state where no ceramic sample was arranged to measure a beam waist position F0 (m) by means of a beam profiler. Thereafter, a sample to be measured (ceramic sample) was set up in the spatial optical system to similarly measure a beam waist position F1 (m) of the outputted light. The variation ($\Delta F$) of the beam waist position is expressed by the following equation.

$$\Delta F(m) = F0 - F1$$

The change of $\Delta F$ increases with an increase in input laser power. A maximum incident laser power [W] at the time when $\Delta F$=up to 0.1 m was determined as a value capable of neglecting a thermal lens (i.e., a maximum input power of laser light which does not generate a thermal lens (a maximum thermal lens-free input power)).

The high-power laser that was used had a maximum power of 100 W. Hence, thermal lens evaluation above this power level was not possible.

The results of the above are indicated together in Table 1.

TABLE 1

| | Composition | x | Crystal system | Optical appearance | Linear transmittance (%/cm) | Verdet constant (Minutes/ (Oe · cm)) | Maximum thermal lens-free input power (W) |
|---|---|---|---|---|---|---|---|
| Reference Example 1-1 | $Tb_{2.00}Hf_{2.00}O_{7.00}$ | 1.00 | Cubic crystal | Colorless transparency | 98 | 0.19 | 80 |
| Example 1-1 | $Tb_{1.998}Hf_{2.002}O_{7.001}$ | 0.999 | Cubic crystal | Colorless transparency | 99 | 0.19 | ≥100 |
| Example 1-2 | $Tb_{1.98}Hf_{2.02}O_{7.01}$ | 0.990 | Cubic crystal | Colorless transparency | 99 | 0.19 | ≥100 |
| Example 1-3 | $Tb_{1.90}Hf_{2.10}O_{7.05}$ | 0.950 | Cubic crystal | Colorless transparency | 99 | 0.18 | ≥100 |
| Example 1-4 | $Tb_{1.80}Hf_{2.20}O_{7.10}$ | 0.900 | Cubic crystal | Colorless transparency | 99 | 0.17 | ≥100 |
| Comparative Example 1-1 | $Tb_{1.60}Hf_{2.40}O_{7.20}$ | 0.800 | Mixed crystal | White devitrification | 0 | — | — |
| Comparative Example 1-2 | $Tb_{1.40}Hf_{2.60}O_{7.30}$ | 0.700 | Mixed crystal | White devitrification | 0 | — | — |
| Reference Example 1-2 | $Tb_{2.00}Sn_{2.00}O_{7.00}$ | 1.00 | Cubic crystal | Colorless transparency | 98 | 0.21 | 90 |
| Example 1-5 | $Tb_{1.80}Sn_{2.20}O_{7.10}$ | 0.900 | Cubic crystal | Colorless transparency | 99 | 0.19 | ≥100 |
| Comparative Example 1-3 | $Tb_{1.40}Sn_{2.60}O_{7.30}$ | 0.700 | Mixed crystal | White devitrification | 0 | — | — |
| Reference Example 1-3 | $Tb_{2.00}Ti_{2.00}O_{7.00}$ | 1.00 | Cubic crystal | Colorless transparency | 97 | 0.22 | 80 |
| Example 1-6 | $Tb_{1.80}Ti_{2.20}O_{7.10}$ | 0.900 | Cubic crystal | Pale yellow transparency | 99 | 0.20 | ≥100 |
| Comparative Example 1-4 | $Tb_{1.40}Ti_{2.60}O_{7.30}$ | 0.700 | Mixed crystal | White devitrification | 0 | — | — |
| Comparative Example 1-5 | $Tb_{1.2}Y_{0.8}O_3$ | — | Cubic crystal | Colorless transparency | 97 | 0.26 | 20 |

From the above results, it has been confirmed that although $Tb_{1.2}Y_{0.8}O_3$ of Comparative Example 1-5 had a maximum thermal lens-free input power of 20 W, Examples 1-4, 1-5 and 1-6 wherein x=0.900 in the formula (1) enables the preparation of magneto-optical materials that are excellent in transparency and have the maximum thermal lens-free input power of at least 100 W. Moreover, in Examples 1-1, 1-2 and 1-3 wherein x=0.999, 0.990 and 0.950, respectively, it has been confirmed that there can be prepared magneto-optical materials that are excellent in transparency and have the maximum thermal lens-free input power of at least 100 W as well. In Reference Examples 1-1, 1-2 and 1-3 wherein x=1.00, the maximum thermal lens-free input power is 80 or 90 W, whereas the maximum thermal lens-free input power in the Examples are at least 100 W and are thus further improved. It will be noted that in Comparative Example 1-1 wherein x=0.800 and in Comparative Examples 1-2, 1-3 and 1-4 wherein x=0.700, all materials were in the form of a mixed crystal, resulting in devitrification.

More particularly, it was confirmed that according to the Examples, there could be prepared magneto-optical materials having a maximum thermal lens-free input power of at least 100 W.

Example 2, Comparative Example 2, and Reference Example 2

Examples are described here in which zirconium was selected as a single element to fill the B site positions (i.e., R in above formula (1)) and x is changed in formula (1).

Terbium oxide powder produced by Shin-Etsu Chemical Co., Ltd., and zirconia powder produced by Nissan Chemical Industries, Ltd., were obtained. The purities were both at least 99.9 wt %. Using the above raw materials, there were prepared a total of 3 types of mixed oxide raw materials wherein x=0.700, 0.900 and 1.00 (i.e. $Tb_{1.40}Zr_{2.60}O_{7.30}$, $Tb_{1.80}Zr_{2.20}O_{7.10}$ and $Tb_{2.00}Zr_{2.00}O_{7.00}$). More particularly, the 3 mixed powders were prepared by weighing out terbium oxide and zirconium oxide so that terbium and zirconium are in appropriate molar ratios, respectively. Next, the respective mixed powders were dispersed and mixed in ethanol within a zircons ball mill while being careful to prevent contamination between the different powders. The treatment time was 24 hours. This was followed by spray-drying treatment, thereby producing granular starting materials, all of which had an average particle size of 20 μm.

Next, these powders were placed in an iridium crucible and fired in a high-temperature muffle furnace at 1,300° C. for a holding time of 3 hours, giving fired starting materials of the respective compositions. Each of the resulting fired materials was subjected to diffraction pattern analysis with a powder x-ray diffractometer from PANalytical B.V. The crystal systems of the samples were identified from these peaks. The case that a peak was split by the influence other than those influences of Cu—Kα1 radiation and Cu—Kα2 radiation and a single crystal system could not be determined was judged as a mixed crystal. It will be noted that where the quality of a magneto-optical material is discussed, it suffices that the case that no single crystal system exists is judged as a mixed crystal. Here, an attempt was made to identify phases other than the crystal phase of the pyrochlore-type oxide from the comparison with reference data of X-ray diffraction patterns and also from Rietveld analyses.

As a result, three fired materials using Zr as the B site (i.e. R=Zr) ($Tb_{1.40}Zr_{2.60}O_{7.30}$, $Tb_{1.80}Zr_{2.20}O_{7.10}$, $Tb_{2.00}Hf_{2.00}O_{7.00}$) had as mixed a fluorite-type oxide phase that was a cubic crystal having a difference lattice constant, aside from the phase of a cubic pyrochlore-type oxide.

Each of the resulting starting materials was uniaxially pressed, then isostatically pressed at a pressure of 198 MPa to give a CIP compact. The resulting CIP compact was subjected to 2 hours of debinding treatment at 1,000° C. in a muffle furnace. The dried compact was then loaded into a vacuum furnace and treated at 1,700° C.±20° C. for 3 hours under a reduced pressure of not more than $2.0 \times 10^{-3}$ Pa, thereby giving a total of 3 sintered compacts. During this operation, the sintering temperature was finely adjusted so that the relative density of each sample when sintered becomes 95%.

Each of the resulting sintered compacts was charged into a carbon heater-type HIP furnace and HIP treated in argon at 200 MPa and 1,650° C. for 3 hours.

Further, the respective sintered bodies obtained in this manner were ground and polished to have a length of 10 mm in the same manner as in Example 1, followed by coating an antireflection coating thereon.

The resulting ceramic samples were subjected to measurement of a linear transmittance in the same way as in Example 1. As depicted in FIG. 1, the respective ceramic samples were set up with polarizer elements on opposite sides thereof and overlaid with a magnet. Thereafter, using a high-power laser (beam diameter, 1.6 mm) manufactured by IPG Photonics Japan, high-power laser light having a wavelength of 1,064 nm was input from both endfaces, and a Verdet constant and maximum input power that does not generate a thermal lens were measured in the same was as in Example 1.

The results of the above are indicated in Table 2.

TABLE 2

| | Composition | x | Crystal system | Optical appearance | Linear transmittance (%/cm) | Verdet constant (Minutes/ (Oe · cm)) | Maximum thermal lens-free input power (W) |
|---|---|---|---|---|---|---|---|
| Reference Example 2-1 | $Tb_{2.00}Zr_{2.00}O_{7.00}$ | 1.00 | Mixed crystal | Colorless birefringence | 90 | 0.19 | 20 |
| Example 2-1 | $Tb_{1.80}Zr_{2.20}O_{7.10}$ | 0.900 | Mixed crystal | Colorless birefringence | 92 | 0.19 | 30 |
| Comparative Example 2-1 | $Tb_{1.40}Zr_{2.60}O_{7.30}$ | 0.700 | Mixed crystal | White slight devitrification | 20 | — | — |

From the above results, it has been confirmed that in Reference Example 2-1 wherein x=1.00 in the formula, (I), the maximum thermal lens-free input power is 20 W, whereas in Example 2-1 wherein x=0.900, there can be prepared a magneto-optical material that is excellent in transparency and is further improved in the maximum thermal lens-free input power that is as high as 30 W. It will be noted that in both Example 2-1 and Reference Example 2-1, an optical appearance was colorless and transparent, but birefringence slightly occurred. In Comparative Example 2-1 wherein x=0.700, a mixed crystal was formed, resulting in devitrification.

More particularly, according to the Example, it was confirmed that there could be prepared a magneto-optical material having a maximum thermal lens-free input power as high as 30 W.

Example 3 and Comparative Example 3

Examples are described here in which in above formula, (1) x is 0.900, and at least one element selected from the group consisting, of silicon, germanium, titanium, tantalum and tin was filled at the B site positions to give compositions other than the compositions Example 1.

Terbium oxide powder produced by Shin-Etsu Chemical Co., Ltd, and silica powder, germanium dioxide powder, titanium oxide powder and stannic oxide powder, all produced by Kojyundo Chemical Laboratory Co., Ltd., and tantalum pentaoxide produced by Showa Chemical Co., Ltd., were obtained. The purities were all at least 99.9 wt %.

Using the above starting raw materials, a variety of complex oxide raw materials were prepared. That is, mixed powders were prepared: a mixed powder obtained by weighing out terbium oxide, silica and zirconia so that molar ratio of terbium, silicon and zirconium is at 1.80:1.10:1.10, a mixed powder obtained by weighing out terbium oxide, germanium dioxide and zirconia so that molar ratio of terbium, germanium and zirconium is at 1.80:1.10:1.10, a mixed powder obtained by weighing out terbium oxide, titanium oxide and tantalum pentaoxide so that molar ratio of terbium, titanium and tantalum is at 1.80:1.10:1.10, a mixed powder obtained by weighing out terbium oxide, stannic oxide and tantalum pentaoxide so that molar ratio of terbium, tin and tantalum is at 1.80:1.10:1.10, a mixed powder obtained by weighing out terbium oxide and silica so that molar ratio of terbium and silicon is at 1.10:2.20, a mixed powder obtained by weighing out terbium oxide and germanium dioxide so that molar ratio of terbium and germanium is at 1.80:2.20, and a mixed powder obtained by weighing out terbium oxide and tantalum pentaoxide so that molar ratio of terbium and tantalum is at 1.80:2.20. Next, the respective mixed powders were dispersed and mixed in ethanol within a zirconia ball mill while being careful to prevent contamination between the different powders. The treatment time was 24 hours. Subsequently, these powders were placed in an iridium crucible and fired in a high-temperature muffle furnace at 1,400° C. for a holding time of 3 hours.

Next, various materials obtained in this way were each dispersed and mixed again in ethanol in a zirconia ball mill. The treatment time was 40 hours. This was followed by spray-drying treatment, thereby producing granular starting complex oxides starting materials, all of which had an average particle size of 20 µm.

Each of the resulting starting materials was uniaxially pressed, then isostatically pressed at a pressure of 198 MPa to give a CIP compact. The resulting CIP compact was subjected to 2 hours of debinding treatment at 1,000° C. in a muffle furnace. The dried compact was then loaded into a vacuum furnace and treated at 1,700° C.±20° C. for 3 hours, thereby giving various types of sintered compacts. During this operation, the sintering temperature was timely adjusted so that the relative density of each sample when sintered becomes 95%.

Each of the resulting sintered compacts was charged into a carbon heater-type HIP furnace and HIP treated in argon at 200 MPa and 1,650° C. for 3 hours. Part of the resulting sintered bodies was ground in a zirconia mortar and formed into a powdery shape. Subsequently, the respective powder samples obtained in the same manner as in Example 1 were subjected to diffraction pattern analysis with a powder X-ray diffraction device, manufactured by PANalytical B.V. As a result, the compositions confirmed as a cubic pyrochlore-type oxide were confirmed to be those groups of $Tb_{1.80}Si_{1.10}Zr_{1.10}O_{7.10}$, $Tb_{1.80}Ge_{1.10}Zr_{1.10}O_{7.10}$, $Tb_{1.80}Ti_{1.10}Ta_{1.10}O_{7.10}$, and $Tb_{1.80}Sn_{1.10}Ta_{1.10}O_{7.10}$. Although revealing pyrochlore-type oxides, the compositions wherein their crystal system became orthorhombic were the groups of $Tb_{1.80}Si_{2.20}O_{7.10}$ and $Tb_{1.80}Ge_{2.20}O_{7.10}$. Finally, as to $Tb_{1.80}Ta_{2.20}O_{7.10}$, there could not be obtained a clear pyrochlore-type diffraction pattern, with the results appearing to be a mixed pattern of three different phases. In this regard, however, exact identification could not be made. Accordingly, this oxide is indicated as $Tb_{1.80}Ta_{2.20}O_{7.10+\alpha}$.

The respective ceramic sintered bodies obtained in this manner were so ground and polished as to have a length of 10 mm. Next, the respective samples were subjected to final optical polishing so that optical end faces thereof were at an optical face accuracy of $\lambda/8$ (in the case of measuring wavelength $\lambda=633$ nm). Moreover, an antireflection coating designed to provide a central wavelength of 1,064 nm was coated. Here, the resulting samples were checked with respect to their optical appearance.

The resulting ceramic samples were subjected to measurement of a linear transmittance in the same way as in Example 1. As depicted in FIG. 1, the respective ceramic samples were set up with polarizer elements on opposite sides thereof and overlaid with a magnet. Thereafter, using a high-power laser (beam diameter, 1.6 mm) manufactured by IPG Photonics Japan, high-power laser light having a wavelength of 1,064 nm was input from both endfaces, and a Verdet constant and maximum input power that does not generate a thermal lens were measured in the same was as in Example 1.

The results of the above are indicated in Table 3.

TABLE 3

| | Composition | x | Crystal system | Optical appearance | Linear transmittance (%/cm) | Verdet constant (Minutes/ (Oe · cm)) | Maximum thermal lens-free input power (W) |
|---|---|---|---|---|---|---|---|
| Example 3-1 | $Tb_{1.80}Si_{1.10}Zr_{1.10}O_{7.10}$ | 0.909 | Cubic crystal | Colorless transparency | 98 | 0.20 | 90 |
| Example 3-2 | $Tb_{1.80}Ge_{1.10}Zr_{1.10}O_{7.10}$ | 0.900 | Cubic crystal | Colorless transparency | 98 | 0.19 | 90 |
| Example 3-3 | $Tb_{1.80}Ti_{1.10}Ta_{1.10}O_{7.10}$ | 0.900 | Cubic crystal | Colorless transparency | 95 | 0.20 | 50 |
| Example 3-4 | $Tb_{1.80}Sn_{1.10}Ta_{1.10}O_{7.10}$ | 0.900 | Cubic crystal | Colorless transparency | 95 | 0.19 | 40 |

TABLE 3-continued

|  | Composition | x | Crystal system | Optical appearance | Linear transmittance (%/cm) | Verdet constant (Minutes/ (Oe · cm)) | Maximum thermal lens-free input power (W) |
|---|---|---|---|---|---|---|---|
| Comparative Example 3-1 | $Tb_{1.80}Si_{2.20}O_{7.10}$ | 0.900 | Orthorhombic crystal | White slight devitrification | 25 | — | — |
| Comparative Example 3-2 | $Tb_{1.80}Ge_{2.20}O_{7.10}$ | 0.900 | Orthorhombic crystal | White slight devitrification | 25 | — | — |
| Comparative Example 3-3 | $Tb_{1.80}Ta_{2.20}O_{7.10+\alpha}$ | 0.900 | Mixed crystal | Gray devitrification | 0 | — | — |

From the above results, it was confirmed that elements which, when used alone to fill the B sites, lead to devitrification or slight devitrification, or incapable of measuring a maximum thermal lens-free input power (these elements being silicon, germanium and tantalum in Comparative Examples 3-1 to 3-3), on being formed into compositions wherein those elements are in solid solution at the B sites together with a suitable third element (Examples 3-1 to 3-4), yield materials having a pyrochlore-type cubic structure as the main phase and a maximum thermal lens-free input power of 40 W or more.

It should be noted that the present invention has been described thus far based the embodiments which should not be construed as limiting the invention thereto. Alterations, such as other embodiments, additions, changes and deletions, can be made within the range anticipated by the person skilled in the art, and any embodiments that exhibit the effect of the invention may be embraced within the scope of the invention.

REFERENCE SIGNS LIST

100 Optical isolator
110 Faraday rotator
120 Polarizer
130 Analyzer
140 Magnet

The invention claimed is:

1. A magneto-optical material, characterized by comprising a transparent ceramic containing as a main component a complex oxide represented by the following formula (1), or comprising a single crystal of a complex oxide represented by the following formula (1)

$$Tb_{2x}R_{2(2-x)}O_{8-x} \quad (1),$$

wherein 0.800<x<1.00, and R represents at least one element selected from the group consisting of silicon, germanium, titanium, tantalum, tin, hafnium and zirconium, but not silicon alone, germanium alone or tantalum alone.

2. The magneto-optical material of claim 1 which is characterized in that when laser light having a wavelength of 1,064 nm is input thereto at a beam diameter of 1.6 mm, for an optical path length of 10 mm, the maximum input power of laser light which does not generate a thermal lens is 30 W or more.

3. The magneto-optical material of claim 2, which, for an optical path length of 10 mm, has a linear transmittance of light at a wavelength of 1,064 nm that is at least 90%.

4. The magneto-optical material of claim 2, which has a main phase comprising a cubic crystal having a pyrochlore lattice.

5. A magneto-optical device which is constructed using the magneto-optical material of claim 2.

6. The magneto-optical material of claim 1 which, for an optical path length of 10 mm, has a linear transmittance of light at a wavelength of 1,064 nm that is at least 90%.

7. The magneto-optical material of claim 6, which has a main phase comprising a cubic crystal having a pyrochlore lattice.

8. A magneto-optical device which is constructed using the magneto-optical material of claim 6.

9. The magneto-optical material of claim 1, which has a main phase comprising a cubic crystal having a pyrochlore lattice.

10. A magneto-optical device which is constructed using the magneto-optical material of claim 9.

11. A magneto-optical device which is constructed using the magneto-optical material of claim 1.

12. The magneto-optical device of claim 11, wherein the device is an optical isolator that comprises the magneto-optical material as a Faraday rotator and polarizing materials provided at front and back sides of the Faraday rotator on an optical axis thereof, and that can be used in a wavelength range of at least 0.9 μm and 1.1 μm or less.

13. The magneto-optical device of claim 12, wherein the Faraday rotator has an antireflection coating on an optical surface thereof.

14. A method for producing a magneto-optical material, comprising the steps of: firing terbium oxide powder and at least one oxide powder selected from the group consisting of silicon oxide, germanium oxide, titanium oxide, tantalum oxide, tin oxide, hafnium oxide and zirconium oxide, but not silicon oxide alone, germanium oxide alone or tantalum oxide alone, in a crucible to prepare a fired starting material containing, as a main component, a cubic pyrochlore-type oxide; pulverizing the fired starting material to form a starting powder; forming the starting powder to a predetermined shape and then sintering the formed powder; and subsequently hot isostatic pressing so as to obtain a transparent ceramic sintered body containing as a main component a complex oxide represented by the following formula (1)

$$Tb_{2x}R_{2(2-x)}O_{8-x} \quad (1),$$

wherein 0.800<x<1.00, and R represents at least one element selected from the group consisting of silicon, germanium, titanium, tantalum, tin, hafnium and zirconium, but not silicon alone, germanium alone or tantalum alone.

15. The method for producing a magneto-optical material of claim 14 wherein the fired starting material is prepared by weighing out the terbium oxide powder and the at least one oxide powder selected from the group consisting of silicon oxide, germanium oxide, titanium oxide, tantalum oxide, tin oxide, hafnium oxide and zirconium oxide so that a molar ratio of the terbium atom to the at least one atom selected from the group consisting of silicon, germanium, titanium, tantalum, tin, hafnium and zirconium is x:(2−x) (wherein x is larger than 0.800 and less than 1.00), mixing the powders and then firing the mixed powders.

* * * * *